US010301496B2

(12) United States Patent
Xia et al.

(10) Patent No.: US 10,301,496 B2
(45) Date of Patent: May 28, 2019

(54) SUBMICRON SILVER PARTICLE INK COMPOSITIONS, PROCESS AND APPLICATIONS

(71) Applicants: Henkel IP & Holding GmbH, Duesseldorf (DE); Henkel AG & Co. KGaA, Duesseldorf (DE)

(72) Inventors: Bo Xia, Irvine, CA (US); Rudolf W. Oldenzijl, Hoogezand (NL); Jianping Chen, Irvine, CA (US); Gunther Dreezen, Balen Olmen (BE)

(73) Assignees: HENKEL IP & HOLDING GMBH, Duesseldorf (DE); HENKEL AG & CO. KGAA, Duesseldorf (DE)

( * ) Notice: Subject to any disclaimer, the term of this patent is extended or adjusted under 35 U.S.C. 154(b) by 216 days.

(21) Appl. No.: 15/044,250

(22) Filed: Feb. 16, 2016

(65) Prior Publication Data
US 2016/0160067 A1 Jun. 9, 2016

Related U.S. Application Data

(63) Continuation of application No. PCT/US2014/045729, filed on Jul. 8, 2014.

(60) Provisional application No. 61/866,825, filed on Aug. 16, 2013.

(51) Int. Cl.
C09D 11/52 (2014.01)
C09D 5/24 (2006.01)
H01B 1/02 (2006.01)
H01B 1/22 (2006.01)
H05K 1/09 (2006.01)
C09D 11/10 (2014.01)
C22C 5/06 (2006.01)
G06F 3/041 (2006.01)

(52) U.S. Cl.
CPC ............... *C09D 11/52* (2013.01); *C09D 5/24* (2013.01); *C09D 11/10* (2013.01); *C22C 5/06* (2013.01); *G06F 3/0412* (2013.01); *H01B 1/02* (2013.01); *H01B 1/22* (2013.01); *H05K 1/095* (2013.01); *H05K 1/097* (2013.01); *G06F 2203/04103* (2013.01); *H05K 2201/0108* (2013.01); *H05K 2201/0154* (2013.01); *H05K 2201/0158* (2013.01); *H05K 2201/10128* (2013.01)

(58) Field of Classification Search
CPC .......... C09D 11/52; C09D 5/24; C09D 11/10; C22C 5/06; G06F 3/0412; G06F 2203/04103; H01B 1/02; H01B 1/22; H05K 1/095; H05K 1/097; H05K 2201/0108; H05K 2201/0154; H05K 2201/0158; H05K 2201/10128
USPC ...................................................... 252/500
See application file for complete search history.

(56) References Cited

U.S. PATENT DOCUMENTS

| 3,229,265 | A | 1/1966 | Brownlow et al. |
|---|---|---|---|
| 4,446,059 | A | 5/1984 | Eustice |
| 4,626,371 | A | 12/1986 | Ikenaga et al. |
| 4,692,360 | A | 9/1987 | Manring et al. |
| 4,692,387 | A | 9/1987 | Reich |
| 5,504,138 | A | 4/1996 | Jacobs |
| 5,565,143 | A | 10/1996 | Chan |
| 5,653,918 | A | 8/1997 | Towlson |
| 5,717,034 | A | 2/1998 | Dershem et al. |
| 5,718,941 | A | 2/1998 | Dershem et al. |
| 5,855,820 | A | 1/1999 | Chan et al. |
| 6,143,356 | A | 11/2000 | Jablonski |
| 6,984,265 | B1 | 1/2006 | Ragues et al. |
| 7,081,214 | B2 | 7/2006 | Matsuba et al. |
| 7,211,205 | B2 | 5/2007 | Conaghan et al. |
| 7,262,511 | B2 | 8/2007 | Osako et al. |
| 7,270,695 | B2 | 9/2007 | Kim et al. |
| 7,491,646 | B2 | 2/2009 | Wu et al. |
| 7,566,360 | B2 | 7/2009 | Garbar et al. |
| 7,857,998 | B2 | 12/2010 | Dorfman |
| 2004/0004209 | A1 | 1/2004 | Matsuba et al. |
| 2004/0144958 | A1 | 7/2004 | Conaghan et al. |
| 2005/0116203 | A1 | 6/2005 | Takahashi et al. |
| 2005/0214480 | A1 | 9/2005 | Garbar et al. |
| 2005/0215689 | A1 | 9/2005 | Garbar et al. |
| 2005/0238804 | A1 | 10/2005 | Garbar et al. |
| 2006/0001726 | A1 | 1/2006 | Kodas et al. |
| 2006/0038304 | A1 | 2/2006 | Osako et al. |
| 2006/0090599 | A1 | 5/2006 | Goia et al. |
| 2006/0090600 | A1 | 5/2006 | Goia et al. |
| 2006/0090601 | A1 | 5/2006 | Goia et al. |

(Continued)

FOREIGN PATENT DOCUMENTS

| AU | 2010349580 | 3/2012 |
|---|---|---|
| CN | 101279370 | 10/2008 |

(Continued)

OTHER PUBLICATIONS

Jiang, Hongjin, et al. "Ultra High Conductivity of Isotropic Conductive Adhesives" Electronic Components and Technology Conference, 2006, pp. 485-490.

(Continued)

*Primary Examiner* — Mark Kopec
*Assistant Examiner* — Danny N Kang
(74) *Attorney, Agent, or Firm* — Taylor M. Coon

(57) ABSTRACT

Provided herein are conductive ink compositions having a good balance between adhesion to substrate, stability of submicron-sized particles, the ability to be sintered at relatively low temperatures, and good electrical conductivity. In one aspect, there are provided conductive networks prepared from compositions according to the present invention. In certain aspects, such conductive networks are suitable for use in touch panel displays. In certain aspects, the invention relates to methods for adhering submicron silver particles to a non-metallic substrate. In certain aspects, the invention relates to methods for improving the adhesion of a submicron silver-filled composition to a non-metallic substrate.

19 Claims, No Drawings

(56) References Cited

U.S. PATENT DOCUMENTS

| | | | |
|---|---|---|---|
| 2006/0189113 A1 | 8/2006 | Vanheusden et al. | |
| 2006/0192183 A1 | 8/2006 | Klyszcz et al. | |
| 2006/0286382 A1 | 12/2006 | Anzures et al. | |
| 2007/0059646 A1 | 3/2007 | Winscom et al. | |
| 2007/0170403 A1 | 7/2007 | Conaghan et al. | |
| 2008/0020572 A1 | 1/2008 | Wu et al. | |
| 2008/0062614 A1 | 3/2008 | Goia | |
| 2008/0093422 A1 | 4/2008 | Kodas et al. | |
| 2008/0105853 A1 | 5/2008 | Ueda et al. | |
| 2008/0250972 A1 | 10/2008 | Oldenzijl | |
| 2009/0149589 A1 | 6/2009 | Thompson et al. | |
| 2009/0209420 A1 | 8/2009 | Kalgutkar et al. | |
| 2009/0314529 A1 | 12/2009 | Petersen | |
| 2010/0021704 A1 | 1/2010 | Yoon et al. | |
| 2010/0127223 A1* | 5/2010 | Dorfman | H01Q 1/2225 252/514 |
| 2010/0189901 A1 | 7/2010 | Chung et al. | |
| 2011/0193032 A1 | 8/2011 | Shi | |
| 2012/0177897 A1* | 7/2012 | Jablonski | B22F 1/0022 428/208 |
| 2012/0232206 A1* | 9/2012 | Wu | C09D 11/36 524/440 |
| 2013/0010400 A1 | 1/2013 | Mcconnell et al. | |
| 2013/0142963 A1* | 6/2013 | Kirk | C09D 11/52 427/553 |

FOREIGN PATENT DOCUMENTS

| | | |
|---|---|---|
| CN | 101629057 | 1/2010 |
| CN | 102140269 | 8/2011 |
| EP | 0299796 | 1/1989 |
| EP | 1139703 | 10/2001 |
| EP | 2285194 | 2/2011 |
| GB | 2479412 | 10/2011 |
| JP | 54153869 | 12/1979 |
| JP | 2010265543 | 11/2010 |
| KR | 1020110058307 | 6/2011 |
| WO | 2004005413 | 1/2004 |
| WO | 2004069941 | 8/2004 |
| WO | 2006093398 | 9/2006 |
| WO | 2006099538 | 9/2006 |
| WO | 2010067965 | 6/2010 |
| WO | 2010079884 | 7/2010 |
| WO | 2010110626 | 9/2010 |
| WO | 2011126704 | 10/2011 |
| WO | 2012105682 | 8/2012 |
| WO | 2012124979 | 9/2012 |
| WO | 20120177897 | 12/2012 |
| WO | 2014021270 | 2/2014 |

OTHER PUBLICATIONS

Jiang, Hongjin, et al. "Surface Functional Silver Nanoparticles for Ultrahigh Conductive Polymer Composites." Chem. Mater., American Chemical Society, vol. 18, No. 13, 2006, pp. 2969-2973.

Jiang, Hongjin, et al. "Conductivity Enhancement of Nano Silver-Filled Conductive Adhesives by Particle Surface Functionalization." Journal of Electronic Materials, vol. 34, No. 11, 2005, pp. 1432-1439.

Moon, Kyong-Sik, et al. "Thermal Behavior of Silver Nanoparticles for Low-Temperature Interconnect Applications." Journal of Electronic Materials, vol. 34, No. 2, 2005, pp. 168-175.

Kim, H., et al. "Dye-sensitized solar cells using laser processing techniques." SPIE's LASE'2004, Jan. 26-30, 2004, San Jose, CA. Proceedings preprint, pp. 1-9.

Kipling, Kent. "Pulsed UV Light for Heat Sensitive Continuous Motion Applications." Xenon Corporation, no date.

International Search Report issued in connection with International Patent Application No. PCT/US2014/045729 dated Oct. 23, 2014.

Burkhard et al., in Angew. Chem. Int. Ed. 2010, 49, 9052-9067.

Encyclopadia of China: Chemistry, vol. 1, Chemical Editorial Board of General Editorial Board of Encyclopadia of China, Encyclopedia of China Publishing House, 1st edition, Feb. 28, 1989, p. 323.

* cited by examiner

SUBMICRON SILVER PARTICLE INK COMPOSITIONS, PROCESS AND APPLICATIONS

FIELD OF THE INVENTION

The present invention relates to silver-containing conductive ink compositions, and various uses thereof. In one aspect, the invention relates to compositions containing stabilized submicron silver particles. In another aspect, the invention relates to conductive networks and methods for preparing same. In yet another aspect, the invention relates to methods for adhering submicron silver particles to a non-metallic substrate.

SUMMARY OF THE INVENTION

In accordance with the present invention, there are provided conductive ink compositions having a good balance between adhesion to substrate, submicron particle stability, the ability to be sintered at relatively low temperatures, and good electrical conductivity. In one aspect, there are provided conductive networks prepared from compositions according to the present invention. In certain aspects, such conductive networks are suitable for use in touch panel displays. In certain aspects, the invention relates to methods for adhering submicron silver particles to a non-metallic substrate. In certain aspects, the invention relates to methods for improving the adhesion of submicron silver particulate-filled thermoplastic resin to a non-metallic substrate.

DETAILED DESCRIPTION OF THE INVENTION

In accordance with the present invention, there are provided compositions comprising:
- stabilized submicron silver particles,
- a thermoplastic resin, and
- optionally, an organic diluent.

Stabilized submicron silver particles typically comprise at least about 20 weight percent of the composition, up to about 95 weight percent thereof. In some embodiments, stabilized submicron silver particles comprise about 30 up to about 90 weight percent of compositions according to the present invention; in some embodiments, stabilized submicron silver particles comprise in the range of about 50 up to about 80 weight percent of compositions according to the present invention.

Stabilized submicron silver particles contemplated for use in the practice of the present invention typically have a particle size in the range of about 100 nanometers up to about 1 micrometer (i.e., 1000 nanometers). In certain embodiments, submicron silver particles contemplated for use herein have a particle size of at least 200 nanometers. In other embodiments of the present invention, submicron silver particles contemplated for use herein have a particle size of at least 250 nanometers. In certain embodiments, submicron silver particles contemplated for use herein have a particle size of at least 300 nanometers. Thus, in some embodiments, submicron silver particles having a particle size in the range of about 200-800 nm are contemplated for use herein; in some embodiments, submicron silver particles having a particle size in the range of about 250-800 nm are contemplated for use herein; in some embodiments, submicron silver particles having a particle size in the range of about 300-800 nm are contemplated for use herein; in some embodiments, submicron silver particles having a particle size in the range of about 200-600 nm are contemplated for use herein; in some embodiments, submicron silver particles having a particle size in the range of about 250-600 nm are contemplated for use herein; in some embodiments, submicron silver particles having a particle size in the range of about 300-600 nm are contemplated for use herein; in some embodiments, submicron silver particles having a particle size in the range of about 200-500 nm are contemplated for use herein; in some embodiments, submicron silver particles having a particle size in the range of about 250-500 nm are contemplated for use herein; in some embodiments, submicron silver particles having a particle size in the range of about 300-500 nm are contemplated for use herein.

Submicron silver particles contemplated for use in the practice of the present invention are typically stabilized. As readily recognized by those of skill in the art, submicron silver particles can be stabilized in a variety of ways, e.g., by the presence of one or more capping agents (which are used to stabilize submicron particles from aggregation). Exemplary capping agents include polyvinyl alcohol, poly(N-vinyl-2-pyrrolidone), gum arabic, α-methacrylic acid, 11-mercaptoundecanoic acid or the disulfide derivative thereof, citric acid, trisodium citrate, stearic acid, palmitic acid, octanoic acid, decanoic acid, polyethylene glycol and derivatives thereof, polyacrylic acid and aminomodified polyacrylic acid, 2-mercaptoethanol, starch, and the like, as well as mixtures of any two or more thereof.

As readily recognized by those of skill in the art, even small amounts of capping agent are effective to stabilize submicron silver particles. Typically, the amount of capping agent falls in the range of about 0.05 up to about 5 weight percent of the composition. In some embodiments, the amount of capping agent employed falls in the range of about 0.1 up to about 2.5 weight percent of the composition.

Submicron silver particles contemplated for use herein can exist in a variety of shapes, e.g., as substantially spherical particles, as irregular shaped particles, oblong particles, flakes (e.g., thin, flat, single crystal flakes), and the like. Submicron silver particles contemplated for use herein include silver coated/plated particulate, wherein the underlying particulate can be any of a variety of materials, so long as the silver coating/plating substantially coats the underlying particulate, such that the resulting composition comprises a thermoplastic matrix having silver-covered particles distributed throughout.

Invention compositions may also optionally additionally contain non-silver conductive filler(s). Exemplary non-silver conductive fillers include carbon black, graphite, carbon nanotubes, and the like.

When non-silver conductive filler is contemplated for use herein, up to about 5 weight percent thereof is contemplated.

Thermoplastic resins contemplated for use herein include vinyl copolymers, polyesters, polyurethanes, and the like. In certain embodiments, thermoplastic resins contemplated for use herein are halogenated thermoplastic resins.

In certain embodiments, compositions according to the present invention comprise vinyl copolymers comprising a first monomer and a second monomer, wherein:
- said first monomer is selected from the group consisting of vinyl acetate, vinyl alcohol, vinyl chloride, vinylidene chloride and styrene, and
- said second monomer is selected from the group consisting of a second vinyl acetate, a second vinyl alcohol, a second vinyl chloride, a second vinylidene chloride, a second styrene, an acrylate and a nitride.

In certain embodiments, the first monomer is vinylidene chloride and the second monomer is vinyl chloride, acrylonitrile, or an alkyl acrylate.

In certain embodiments, the first monomer is vinylidene chloride and the second monomer is vinyl chloride (e.g., polyvinylidene chloride). In certain embodiments, the first monomer is vinylidene chloride and the second monomer is acrylonitrile. In certain embodiments, the first monomer is vinylidene chloride and the second monomer is an alkyl acrylate.

Typically, thermoplastic resins contemplated for use herein comprise in the range of about 0.1 up to about 15 weight percent of the composition. In some embodiments, thermoplastic resins contemplated for use herein comprise in the range of about 0.5 up to about 15 weight percent of the composition; in some embodiments, thermoplastic resins contemplated for use herein comprise in the range of about 1 up to about 15 weight percent of the composition; in some embodiments, thermoplastic resins contemplated for use herein comprise in the range of about 0.1 up to about 12 weight percent of the composition; In some embodiments, thermoplastic resins contemplated for use herein comprise in the range of about 0.1 up to about 8 weight percent of the composition; in some embodiments, thermoplastic resins contemplated for use herein comprise in the range of about 0.5 up to about 12 weight percent of the composition; in some embodiments, thermoplastic resins contemplated for use herein comprise in the range of about 0.5 up to about 8 weight percent of the composition; in some embodiments, thermoplastic resins contemplated for use herein comprise in the range of about 1 up to about 12 weight percent of the composition; in some embodiments, thermoplastic resins contemplated for use herein comprise in the range of about 1 up to about 8 weight percent of the composition.

In accordance with certain embodiments, invention compositions may optionally further comprise one or more thermoset resins therein.

When present, a wide variety of thermoset resins are contemplated for use herein, e.g., epoxy-functionalized resins, acrylates, cyanate esters, silicones, oxetanes, maleimides, and the like, as well as mixtures of any two or more thereof.

A wide variety of epoxy-functionalized resins are contemplated for use herein, e.g., liquid-type epoxy resins based on bisphenol A, solid-type epoxy resins based on bisphenol A, liquid-type epoxy resins based on bisphenol F (e.g., Epiclon EXA-835LV), multifunctional epoxy resins based on phenol-novolac resin, dicyclopentadiene-type epoxy resins (e.g., Epiclon HP-7200L), naphthalene-type epoxy resins, and the like, as well as mixtures of any two or more thereof.

Exemplary epoxy-functionalized resins contemplated for use herein include the diepoxide of the cycloaliphatic alcohol, hydrogenated bisphenol A (commercially available as Epalloy 5000), a difunctional cycloaliphatic glycidyl ester of hexahydrophthallic anhydride (commercially available as Epalloy 5200), Epiclon EXA-835LV, Epiclon HP-7200L, and the like, as well as mixtures of any two or more thereof.

Acrylates contemplated for use in the practice of the present invention are well known in the art. See, for example, U.S. Pat. No. 5,717,034, the entire contents of which are hereby incorporated by reference herein.

Cyanate esters contemplated for use in the practice of the present invention are well known in the art. See, for example, U.S. Pat. No. 5,718,941, the entire contents of which are hereby incorporated by reference herein.

Silicones contemplated for use in the practice of the present invention are well known in the art. See, for example, U.S. Pat. No. 5,717,034, the entire contents of which are hereby incorporated by reference herein.

Oxetanes (i.e., 1,3-propylene oxides) are heterocyclic organic compounds with the molecular formula $C_3H_6O$, having a four-membered ring with three carbon atoms and one oxygen atom. The term oxetane also refers generally to any organic compound containing an oxetane ring. See, for example, Burkhard et al., in Angew. Chem. Int. Ed. 2010, 49, 9052-9067, the entire contents of which are hereby incorporated by reference herein.

Maleimides contemplated for use in the practice of the present invention are well known in the art. See, for example, U.S. Pat. No. 5,717,034, the entire contents of which are hereby incorporated by reference herein.

When present, relatively low levels of thermoset resin are contemplated for use herein; typically, when present, thermoset resins comprise only about 0.1 up to about 5 weight percent of the composition. In some embodiments, thermoset resins comprise about 0.2 up to about 3 weight percent of the total composition.

Organic diluents contemplated for optional use herein include esters (e.g., ethyl acetate, butyl acetate, methoxy propyl acetate, and the like); dibasic esters, alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, ketones, esters, aromatic hydrocarbons (e.g., benzene, toluene, xylene), saturated hydrocarbons (e.g., hexane, cyclohexane, heptane, tetradecane), ethers (e.g., diethyl ether, tetrahydrofuran, dioxane), chlorinated hydrocarbons (e.g., dichloroethane, trichloroethylene, chloroform, dichloromethane), and the like, as well as mixtures of any two or more thereof.

The amount of organic diluent contemplated for use in accordance with the present invention can vary widely, typically falling in the range of about 5 up to about 80 weight percent of the composition. In certain embodiments, the amount of organic diluent falls in the range of about 10 up to 60 weight percent of the total composition. In some embodiments, the amount of organic diluent falls in the range of about 20 up to about 50 weight percent of the total composition.

Optionally, compositions described herein may include flow additives, and the like. Flow additives contemplated for optional use herein include silicon polymers, ethyl acrylate/2-ethylhexyl acrylate copolymers, alkylol ammonium salt of phosphoric acid esters of ketoxime, and the like, as well as combinations of any two or more thereof.

Additional optional components contemplated for use herein include acidic components which enhance conductivity of the resulting composition. When used, a wide variety of acidic components are suitable for incorporation into invention compositions, so long as such components are miscible with the other components of compositions according to the present invention. Such acidic materials are weak-to-mild acids, typically having a pH<7. In certain embodiments, acidic components contemplated for use herein have a pH in the range of at least 1, but less than 7. In certain embodiments, acidic components contemplated for use herein have a pH in the range of at least 2 up to about 6. Exemplary acidic components contemplated for use herein include phosphoric acid, vinylphosphoric acid, polyphosphoric acid, formic acid, acetic acid, chloroacetic acid, trifluoroacetic acid, oxalic acid, oleic acid, benzoic acid, p-toluenesulfonic acid, and the like, as well as mixtures of any two or more thereof.

Suitable quantities of the acidic component, when optionally included in invention compositions, typically fall in the range of about 0.1 up to about 5 weight percent of the composition. In certain embodiments, the amount of acidic component, when optionally included in invention compositions, will fall within the range of about 0.5 up to 2 weight percent.

In accordance with another embodiment of the present invention, there are provided methods of preparing conductive networks, said method comprising:
applying a composition as described herein to a suitable substrate, and thereafter sintering said composition.

A wide variety of substrates are contemplated for use herein, so long as they are non-conductive. Exemplary substrates include a polyethylene terephthalate, a polymethyl methacrylate, a polyethylene, a polypropylene, a polycarbonate, an epoxy resin, a polyimide, a polyamide, a polyester, glass, or the like.

A particular advantage of compositions according to the present invention is that they can be sintered at relatively low temperatures, e.g., in some embodiments at temperatures no greater than about 150° C. When sintered at such temperatures, it is contemplated that the composition be exposed to sintering conditions for a time in the range of 0.5 up to about 30 minutes.

In certain embodiments, it is contemplated that sintering may be carried out at a temperature no greater than about 120° C. When sintered at such temperatures, it is contemplated that the composition be exposed to sintering conditions for a time in the range of 0.1 up to about 2 hours.

In accordance with yet another embodiment of the present invention, there are provided conductive networks comprising a sintered array of submicron silver particles having a resistivity of no greater than $1 \times 10^{-4}$ Ohms·cm. In accordance with still another embodiment of the present invention, there are provided conductive networks comprising a sintered array of submicron silver particles having a resistivity of no greater than $1 \times 10^{-5}$ Ohms·cm.

Such conductive networks are typically applied to a substrate, and display substantial adhesion thereto. Adhesion between the conductive network and the substrate can be determined in a variety of ways, e.g., by ASTM standard cross-cut tape test pursuant to test method D 3359-97. In accordance with the present invention, adhesion comparable to at least ASTM level 1B is observed (i.e., at least 35% of the originally adhered film surface remains attached to the substrate after being subjected to the tape test). In certain embodiments of the present invention, adhesion comparable to at least ASTM level 2B is observed (i.e., at least 65% of the originally adhered film surface remains attached to the substrate after being subjected to the tape test). In certain embodiments of the present invention, adhesion comparable to at least ASTM level 3B is observed (i.e., at least 85% of the originally adhered film surface remains attached to the substrate after being subjected to the tape test). In certain embodiments of the present invention, adhesion comparable to at least ASTM level 4B is observed (i.e., at least 95% of the originally adhered film surface remains attached to the substrate after being subjected to the tape test). In certain embodiments of the present invention, adhesion comparable to at least ASTM level 5B is observed (i.e., 100% of the originally adhered film surface remains attached to the substrate after being subjected to the tape test).

In accordance with still another embodiment of the present invention, there are provided methods for adhering submicron silver particles to a non-metallic substrate, said method comprising:
applying a composition as described herein to said substrate, and thereafter sintering said composition.

In accordance with this embodiment of the present invention, sintering under low temperature (e.g., at a temperature no greater than about 150° C.; or at a temperature no greater than about 120° C.) is contemplated.

In accordance with a further embodiment of the present invention, there are provided methods for improving the adhesion of submicron silver particle-filled thermoplastic resin to a non-metalic substrate, said method comprising incorporating into said silver particle-filled thermoplastic resin:
a halogen-containing thermoplastic resin, and
an organic diluent.
Submicron silver particles, thermoplastic resins, and organic diluents as described herein are contemplated for use in this embodiment of the present invention.

In accordance with yet another embodiment of the present invention, there are provided touch panel displays comprising a transparent substrate having an electrically conductive layer thereon, wherein said electrically conductive layer comprises a cured layer of a composition according to the invention.

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

EXAMPLE 1

Ink was made by mixing submicron silver particles with the desired amount of thermoplastic (Tp) resin. Mixing was carried out in a Speedmixer until the composition was substantially homogeneous. Material was applied to a substrate (polyethylene terphthalate; PET) and a film prepared with a 10 micron wire bar. The material was then dried at 120° C. for 5 minutes, or 150° C. for 5 minutes in a box oven. A 0.5 by 5 cm piece was cut, and the thickness and resistance thereof was measured, and the resistance calculated based thereon. Results are presented in the following Table.

TABLE

| Component | Sample no. | | | | | | | |
|---|---|---|---|---|---|---|---|---|
| | 1 | 2 | 3 | 4 | 5 | 6 | 7 | 8 |
| Ag.(quant; particle size) | 100% 300-500 nm | 94% 300-500 nm | 94% 1-3 μm | 94% 2-7 μm | 94% 300-500 nm | 94% 300-500 nm | 94% D50 = 8 μm | 94% D50 = 400 nm |

TABLE-continued

| Component | Sample no. | | | | | | | |
|---|---|---|---|---|---|---|---|---|
| | 1 | 2 | 3 | 4 | 5 | 6 | 7 | 8 |
| Tp Resin* | None | PVDC, 6% | PVDC, 6% | PVDC, 6% | TPU, 6% | PE, 6% | PVDC, 6% | PVDC, 6% |
| Diluent | — | — | — | — | — | — | — | — |
| Volume resistivity, Ohm · cm | | | | | | | | |
| 5 min @120 C. | 2.54E−05 | 8.50E−06 | 7.95E−06 | 2.70E−05 | 4.91E−05 | 4.49E−05 | 3.08E−05 | NC** |
| 5 min @150 C. | 1.80E−05 | 6.20E−06 | 5.10E−06 | 6.10E−06 | 2.90E−05 | 2.31E−05 | 1.78E−05 | NC |
| Adhesion to PET | Fair | VG*** | VG | VG | VG | VG | VG | VG |

*PVDC = polyvinylidene chloride
TPU = thermoplastic polyurethane
PE = polyester
**NC = not conductive
***VG = Very good The results set forth in the preceding Table demonstrate that the mere addition of a small amount (6 wt %) of a halogenated thermoplastic polymer such as polyvinylidene chloride to a submicron silver particulate material reduces the thickness to which the composition can be applied, and significantly reduces the resistivity thereof.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. An ink composition comprising:
   a) stabilized submicron silver particles, wherein said stabilized submicron silver particles comprise silver particles having a particle size of at least about 200 nanometers but less than about 1 micrometer;
   b) a halogenated thermoplastic resin;
   c) optionally an organic diluent;
   wherein the stabilized submicron silver particles are present in the ink composition in an amount in the range of about 20 to about 95 weight percent of the composition, said halogenated thermoplastic resin is present in the ink composition in an amount in the range of about 6 to about 8 weight percent of the composition and said organic diluent, when present, is present in the ink composition in an amount in the range of about 5 up to about 80 weight percent of the composition.

2. The ink composition of claim 1 wherein said stabilized submicron silver particles comprise silver particles having a particle size of at least about 250 nanometers but less than about 800 nanometers.

3. The ink composition of claim 2 wherein said stabilized submicron silver particles are stabilized by the presence of one or more capping agents, wherein the capping agent is selected from the group consisting of poly(N-vinyl-2-pyrrolidone), gum arabic, α-methacrylic acid, 11-mercaptoundecanoic acid or the disulfide derivative thereof, citric acid, trisodium citrate, stearic acid, palmitic acid, octanoic acid, decanoic acid, polyethylene glycol and derivatives thereof, polyacrylic acid and aminomodified polyacrylic acid, 2-mercaptoethanol, starch, or a mixture of any two or more thereof.

4. The ink composition of claim 3 wherein said capping agent comprises in the range of about 0.05 up to about 5 weight percent of the composition.

5. The ink composition of claim 1 further comprising up to 5 weight percent of a non-silver conductive filler.

6. The ink composition of claim 5 wherein said non-silver conductive filler is carbon black, graphite or carbon nanotube.

7. The ink composition of claim 1 wherein said thermoplastic resin is a vinyl copolymer, a polyester or a polyurethane.

8. The ink composition of claim 7 wherein said vinyl copolymer comprises a first monomer and a second monomer, wherein:
   said first monomer is selected from the group consisting of vinyl acetate, vinyl alcohol, vinyl chloride, vinylidene chloride and styrene, and
   said second monomer is selected from the group consisting of a second vinyl acetate, a second vinyl alcohol, a second vinyl chloride, a second vinylidene chloride, a second styrene, an acrylate and a nitride.

9. The ink composition of claim 8 wherein said first monomer is vinylidene chloride and said second monomer is vinyl chloride, acrylonitrile, or an alkyl acrylate.

10. The ink composition of claim 1 further comprising in the range of about 0.1 up to about 5 weight percent of a thermoset resin.

11. The ink composition of claim 10 wherein said thermoset resin is an epoxy-functionalized resin, an acrylate, a cyanate ester, a silicone, an oxetane, a maleimide, or a mixture of any two or more thereof.

12. The ink composition of claim 1 wherein said organic diluent is selected from the group consisting of ethyl acetate, butyl acetate, methoxy propyl acetate, alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, ketones, esters, dibasic esters, benzene, toluene, xylene, hexane, cyclohexane, heptane, tetradecane, diethyl ether, tetrahydrofuran, dioxane, dichloroethane, trichloroethylene, chloroform, dichloromethane, and mixtures of any two or more thereof.

13. The ink composition of claim 1, further comprising an acidic component.

14. The ink composition of claim 13 wherein said acidic component is phosphoric acid, vinylphosphoric acid, polyphosphoric acid, formic acid, acetic acid, chloroacetic acid, trifluoroacetic acid, oxalic acid, oleic acid, benzoic acid, p-toluenesulfonic acid, or a mixture of any two or more thereof.

15. The ink composition of claim 13 wherein said acidic component comprises in the range of about 0.1 up to about 5 weight percent of the composition.

16. A touch panel display comprising a transparent substrate having an electrically conductive layer thereon, wherein said electrically conductive layer comprises a cured layer of the ink composition of claim 1.

17. A conductive network comprising a sintered array comprising the composition of claim 1 having a resistivity of no greater than $1 \times 10^{-4}$ Ohms·cm.

18. The conductive network of claim 17 further comprising a substrate therefor, wherein the adhesion between said conductive network and said substrate is at least level 1B, as determined by ASTM standard cross-cut tape test pursuant to test method D 3359-97.

19. An ink composition comprising:
a) stabilized submicron silver particles, wherein said stabilized submicron silver particles comprise silver particles having a particle size of at least about 200 nanometers but less than about 1 micrometer;
b) a thermoplastic resin, wherein said thermoplastic resin is a vinyl copolymer, and wherein said vinyl copolymer comprises a first monomer and a second monomer, wherein:
said first monomer is selected from the group consisting of vinyl acetate, vinyl alcohol, vinyl chloride, vinylidene chloride and styrene, and
said second monomer is selected from the group consisting of a second vinyl acetate, a second vinyl alcohol, a second vinyl chloride, a second vinylidene chloride, a second styrene, an acrylate and a nitride,
c) optionally an organic diluent,
wherein the stabilized submicron silver particles are present in the ink composition in an amount in the range of about 20 to about 95 weight percent of the composition, said halogenated thermoplastic resin is present in the ink composition in an amount in the range of about 6 to about 8 weight percent of the composition and said organic diluent, when present, is present in the ink composition in an amount in the range of about 5 up to about 80 weight percent of the composition.

* * * * *